United States Patent [19]

Hashimoto et al.

[11] Patent Number: 5,496,967
[45] Date of Patent: Mar. 5, 1996

[54] PACKAGE FOR HOLDING IC CHIP

[75] Inventors: Shizuki Hashimoto; Nobuhiro Nishijima, both of Mine, Japan

[73] Assignee: Kabushiki Kaisha Sumitomo Kinzoku Ceramics, Yamaguchi, Japan

[21] Appl. No.: 173,519

[22] Filed: Dec. 28, 1993

[30] Foreign Application Priority Data

Dec. 29, 1992 [JP] Japan .................................... 4-361050

[51] Int. Cl.⁶ .................................................. H01L 23/02
[52] U.S. Cl. ........................... 174/52.4; 257/700; 361/813
[58] Field of Search ................................. 174/52.4, 52.2, 174/52.3, 52.1; 257/666, 676, 684, 700, 701, 703, 787; 361/767, 813; 29/827, 830, 831, 832, 841, 846, 850, 851, 852

[56] References Cited

U.S. PATENT DOCUMENTS

| | | | |
|---|---|---|---|
| 4,806,188 | 2/1989 | Rellick | 156/89 |
| 4,867,935 | 9/1989 | Morrison, Jr. | 156/89 X |
| 5,012,323 | 4/1991 | Farnworth | 174/52.4 X |
| 5,223,741 | 6/1993 | Bechtel | 257/678 |

FOREIGN PATENT DOCUMENTS 4-124867  4/1992  Japan .

*Primary Examiner*—Morris H. Nimmo
*Assistant Examiner*—Christopher Horgan
*Attorney, Agent, or Firm*—Flynn, Thiel, Boutell & Tanis

[57] ABSTRACT

A package for holding at least one integrated circuit (IC) chip includes an IC chip, a lead frame, and a ceramic relay substrate with a wiring pattern. Respective portions of the wiring pattern are connected to the IC chip and the lead frame by respective bonding wires. The substrate includes at least one green tape with at least part of the wiring pattern thereon, and formed by printing a metal paste on the green tape and then firing it. An opening may be provided in the green tape to receive the IC chip. The assembly, which includes the IC chip, the substrate, and part of the leads of the lead frame, is sealed in a resin molding using a molding technique.

21 Claims, 4 Drawing Sheets

PACKAGE FOR HOLDING IC CHIP

FIELD OF THE INVENTION

The present invention relates to a package for holding an IC chip or IC chips and more specifically, to a package capable of holding an IC chip or IC chips in a high density circuit, or in other words a package capable of forming a circuit component having a large number of pins, and suitable for holding an IC chip or IC chips by electrically connecting the IC chip or IC chips through a relay substrate provided with wiring patterns to a lead frame and sealing the IC chip, the ceramic relay substrate and part of the lead frame in a resin molding.

BACKGROUND OF THE INVENTION

Generally, a package of this kind for holding an integrated circuit (IC) chip has a lead frame provided with a chip mount on which the IC chip is mounted. The IC chip mounted on the chip mount is connected to the lead frame by bonding wire, and the IC chip and part of the lead frame are sealed in a resin, such as an epoxy resin, by transfer molding.

The package of this kind has been widely used, because the package of this kind uses a lead frame which is part of a plurality of successive lead frames in order to make an automatic holding process possible, and enable a batch type molding process.

Although the package of this kind can be mass-produced at a comparatively low cost, the package entails the following problems.

(1) Since a pitch which can be provided between adjacent edges of the inner leads of the lead frame by presently available techniques is on the order of 0.2 mm at the smallest, an increase in the circuit density, that is, an increase in the number of pin contacts, is limited by the pitch of the leads.

(2) Since a further reduction of the pitch of the inner leads of the lead frame is difficult, a further reduction of the intervals between bonding pads is difficult, and hence a large size package must be used for high-density holding requiring 200 to 500 pin contacts.

A package for holding an IC chip is proposed in Japanese Patent Laid-open (Kokai) No. 4-124867 to cope with such problems. A multilayer printed-circuit board serving as a relay board is disposed between a lead of the frame and an IC chip, the IC chip being connected electrically to the inner leads of the printed-circuit board by bonding wire and the outer leads of the printed-circuit board being connected electrically to the leads of the lead frame by bonding wire to thereby connect the IC chip electrically to the leads of the lead frame, and the printed-circuit board, the IC chip part of the leads of the lead frame are sealed in a resin molding by a molding technique.

The multilayer printed-circuit board is fabricated by laminating paper impregnated with epoxy resin, laminating paper impregnated with phenol resin, or fiberglass sheets impregnated with epoxy resins. The above relay board entails the following problems.

(1) The strength of the multi-layer printed-circuit board serving as a relay board is not sufficiently high because the multilayer printed-circuit board is made by laminating paper sheets or fiberglass sheets impregnated with a synthetic resin, such as an epoxy resin.

(2) There is the possibility that the relay board having paper sheets or fiberglass sheets impregnated with a synthetic resin can be distorted by the molding process. The relay board must have a comparatively large thickness to prevent being distorted, and thus a large size of the package is required.

(3) The thermal resistance of the relay board is not sufficiently high.

(4) The wiring patterns require complicated manufacturing processes, including etching processes for copper films or the like.

SUMMARY OF THE INVENTION

The present invention has been made in view of the foregoing problems and it is therefore a first object of the present invention to provide a package for holding an IC chip or IC chips, and capable solving the foregoing problems.

A second object of the present invention is to provide a resin encapsulated package.

A third object of the present invention is to provide a sealing method for an IC chip or IC chips.

A fourth object of the present invention is to provide a package for holding an IC chip or IC chips, which has a comparatively small thickness, is capable of avoiding distortion of the relay substrate during a molding process, has a high thermal resistance, and is capable of coping with an increase in the number of pin contacts.

In a first aspect of the present invention, a package for holding an IC chip includes: an IC chip supporting means; a lead frame; a ceramic relay substrate provided with a metallized wiring pattern disposed between the IC chip supporting means and the leads of the lead frame; wherein portions of the metallized wiring pattern near the IC chip as supported on the IC chip supporting means are exposed on the surface of the ceramic relay substrate to form inner leads to be electrically connected to the IC chip, and wherein portions of the wiring pattern in the periphery of the relay substrate adjacent to the leads of the lead frame are exposed on the surface of the ceramic relay substrate to form outer leads to be electrically connected to the leads of the lead frame.

In a second aspect of the present invention, a package for holding an IC chip includes: an IC chip supporting means; a lead frame; a ceramic relay substrate disposed between the IC chip supporting means and the leads of the lead frame; wherein the ceramic relay substrate is formed by printing a metal paste in a wiring pattern on a ceramic green tape and firing the ceramic green tape provided with the printed wiring pattern to sinter the ceramic green tape and form a metallized wiring pattern, or by printing a metal paste in a wiring pattern on each of a plurality of ceramic green tapes, superposing the plurality of ceramic green tapes provided with the printed wiring patterns to form a laminated green tape, and firing the ceramic green tape provided with the plurality of wiring pattern to sinter the ceramic green tape and form layered metallized wiring patterns; wherein portions of the metallized wiring pattern near the IC chip as supported on the IC chip supporting means are exposed on the surface of the ceramic relay substrate to form inner leads to be electrically connected to the IC chip, and wherein portions of the wiring pattern in the periphery of the relay substrate adjacent to the leads of the lead frame are exposed on the surface of the ceramic relay substrate to form outer leads to be electrically connected to the leads of the lead frame.

In a third aspect of the present invention, a resin encapsulated package includes: an IC chip supporting means; a lead frame; a ceramic relay substrate disposed between the IC chip supporting means and the leads of the lead frame; wherein the ceramic relay substrate is formed by printing a metal paste in a wiring pattern on a ceramic green tape and firing the ceramic green tape provided with the printed wiring pattern to sinter the ceramic green tape and form a metallized wiring pattern, or by printing a metal paste in a wiring pattern on each of a plurality of ceramic green tapes, superposing the plurality of ceramic green tapes provided with the printed wiring patterns to form a laminated green tape, and firing the ceramic green tape provided with the plurality of wiring patterns to sinter the ceramic green tape and form layered metallized wiring patterns; wherein portions of the metallized wiring pattern near the IC chip as supported on the IC chip supporting means are exposed on the surface of the ceramic relay substrate to form inner leads to be electrically connected to the IC chip, wherein portions of the wiring pattern in the periphery of the relay substrate adjacent to the leads of the lead frame are exposed on the surface of the ceramic relay substrate to form outer leads to be electrically connected the leads of the lead frame; and wherein the IC chip, the ceramic relay substrate, and part of the leads of the lead frame are sealed in a resin molding.

An IC chip sealing method in accordance with the present invention for electrically connecting an IC chip to the leads of a lead frame and sealing the IC chip in resin molding, including the steps of: forming a ceramic relay substrate by printing a metal paste in a wiring pattern on a ceramic green tape and firing the ceramic green tape provided with the printed wiring pattern to sinter the ceramic green tape and form a metallized wiring pattern, or by printing a metal paste in a wiring pattern on each of a plurality of ceramic green tapes, superposing the plurality of ceramic green tapes provided with the printed wiring patterns to form a laminate of green tapes, and firing the ceramic green tape provided with the plurality of wiring patterns to sinter the ceramic green tape and form layered metallized wiring patterns; interposing the ceramic relay substrate between the leads of the lead frame and the IC chip; electrically connecting the IC chip to inner leads formed by exposed portions of the metallized wiring pattern on the surface of the ceramic relay substrate; electrically connecting the leads of the lead frame to outer leads formed by exposed portions of the metallized wiring pattern on the surface of the ceramic relay substrate; and sealing the IC chip, the ceramic relay substrate, and part of the leads of the lead frame in a resin molding.

Since the ceramic relay substrate provided with the metallized wiring pattern is made of a ceramic material, the package has a sufficiently high strength, and the relay substrate will not be distorted during molding. Since the thickness of the relay substrate formed of a ceramic material may be comparatively small, the package having a comparatively small thickness has a sufficiently high strength and has satisfactory thermal resistance. Since the metallized wiring pattern can be formed with a comparatively small pitch by printing conductive lines on the ceramic green sheets and co-firing, the package that enables high-density holding can be fabricated without requiring a complicated processes. Since the IC chip is connected to the lead frame through the ceramic relay substrate made of a ceramic material and provided with a wiring pattern, the size of the IC chip need not be very large.

BRIEF DESCRIPTION OF THE DRAWINGS

The above and other objects, features and advantages of the present invention will become more apparent from the following description, taken in connection with the accompanying drawings, in which.

DESCRIPTION OF THE PREFERRED EMBODIMENTS

First Embodiment

A package for holding an integrated circuit (IC) chip, in a first embodiment according to the present invention, is a resin-molded package which includes as principal components, an IC chip a (FIG. 1), a relay ceramic substrate 1, a lead frame 2, and a resin molding 3.

Figure 3A:
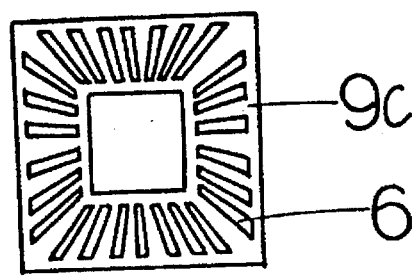
FIGS. 3a, 3b and 3c are each a diagrammatic top view of a respective lamina in a ceramic relay substrate of the embodiment of FIG. 1.
Figure 3B:
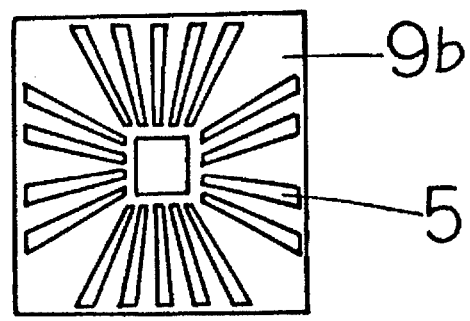
Figure 3C:
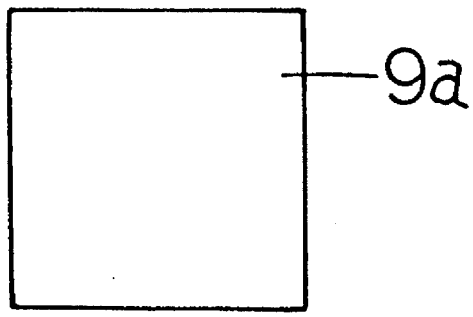

The ceramic relay substrate 1 is a three-layered ceramic laminae having layers 1a, 1b and 1c. The ceramic lamina 1b and 1c are each provided with a cavity 4 for receiving the IC chip a, which rests on a central area of the upper surface on the ceramic lamina 1a. The lamina 1b of the ceramic relay substrate 1 is provided with a first metallized wiring pattern 5 extending radially in all directions for electrically connecting the IC chip a to leads 2a of the lead frame 2, and the lamina 1c is provided with a second metallized wiring pattern 6 extending radially in all directions for electrically connecting the IC chip a to the leads 2a of the lead frame 2. Portions of the first metallized wiring pattern 5 at the inner periphery of the ceramic relay substrate 1 adjacent the cavity 4 and those of the same at the periphery of the ceramic relay substrate 1 are exposed. The exposed portions of the first metallized wiring pattern 5 adjacent the cavity 4 serve as first inner leads 5a, and the exposed portions of the first metallized wiring pattern 5 in the outer periphery of the ceramic relay substrate 1 serve as first outer leads 5b. The second metallized wiring pattern 6 formed on the lamina 1c is exposed on the surface of the ceramic relay substrate 1. Portions of the second metallized wiring pattern 6 adjacent the cavity 4 serve as second inner leads 6a, and portions of the same at the periphery of the ceramic relay substrate 1 serve as second outer leads 6b. The ceramic relay substrate 1 is seated on an island portion 2b of a lead frame 2. As shown in FIGS. 3a–3c, the ceramic relay substrate 1 of a three-layer structure is formed by superposing polygonally-shaped laminae, namely, (1) a ceramic green tape 9a for lamina 1a of 21.3 mm in length, 21.3 mm in width and 0.25 mm in thickness, (2) a ceramic green tape 9b for lamina 1b of 21.3 mm in length, 21.3 mm in width and 0.25 mm in thickness and provided with a metallized wiring pattern extending radially in all directions and which has 152 leads, which corresponds to the first metallized wiring pattern 5 and which is formed by printing tungsten paste, and (3) a ceramic green tape 9c for lamina 1c of 19.1 mm in length, 19.1 mm in width and 0.25 mm in thickness and provided with a metallized wiring pattern extending radially in all directions and having 152 leads. For clarity, only some of the 152 leads are shown. Tapes 9b and 9c are each provided with an opening corresponding to the cavity 4. The three-layer structure of green tapes 9a, 9b and 9c with radially extending wiring patterns is co-fired at temperatures in the range of 1500°–1600° C., and then the exposed portions of the first metallized wiring pattern 5 and the second metallized wiring pattern 6 are subjected to electroless Ni-plating and electroless Au-plating in order to plate the exposed portions with a Ni film having a thickness in the range of 1 to 9 μm and an Au film of 0.1 to 0.3 μm in thickness.

The ceramic green tapes 9a, 9b and 9c are made of $Al_2O_3$. In addition, the ceramic relay substrate 1 may be made of any suitable material other than $Al_2O_3$, such as AlN or a glass ceramic, provided that the wiring patterns can be formed thereon. The wiring patterns may be formed of any suitable conductive material other than tungsten, such as Mo, Au, Ag or Cu according to the kind of ceramic material.

The minimum pitch among the pitches of the first inner leads 5a of the first metallized wiring pattern 5, and the second inner leads 6a of the second metallized wiring pattern 6 on the ceramic relay substrate 1, is 80 μm. The first inner leads 5a and the second inner leads 6a are formed so as to be connected to the IC chip a with bonding wires 7. The first outer leads 5b of the first metallized wiring pattern 5, and the second outer leads 6b of the second wiring pattern 6, are connected electrically to the leads 2a of the lead frame 2 by bonding wires 8. Thus, the IC chip a is connected electrically to the leads 2a of the lead frame 2 by signal lines.

The assembly, which includes the ceramic relay substrate 1, the IC chip a supported on the ceramic relay substrate 1, and the leads 2a of the lead frame 2 electrically connected by the metallized wiring patterns 5 and 6 of the ceramic relay substrate 1 to the IC chip a, is subjected to transfer molding, in order to seal the ceramic relay substrate 1, part of each lead 2a of the lead 2a of the lead frame 2, and the IC chip a in a resin molding 3 of a suitable resin, such as an epoxy resin or a silicone resin.

Figure 8:
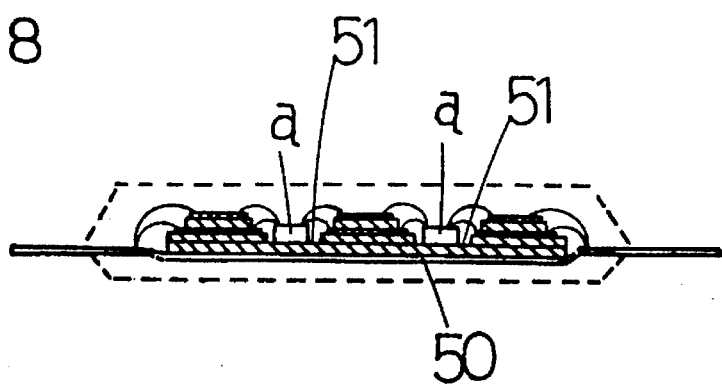
FIG. 8 is a longitudinal sectional view of a package in a further embodiment which is a modification of the package in the first embodiment of FIG. 1.

In the package of the first embodiment, the IC chip a is connected electrically to the lead frame 2 through the ceramic relay substrate 1 having the metallized wiring patterns 5 and 6 of metallized conductive lines serving as signal lines. The metallized conductive lines of the metallized wiring patterns 5 and 6 of the ceramic relay substrate 1 can be formed by metallizing processes at pitches smaller than those of conductive lines formed by etching a conductive film, such as a copper film, in a multilayer printed-circuit board. Accordingly, the package is suitable for forming a resin-sealed circuit component having a large number of leads. In a modification, a ceramic relay substrate 50 having multiple cavities 51 as shown in FIG. 8 may be used.

The ceramic relay substrate made of a ceramic material employed in the package of the first embodiment according to the present invention has a bending strength of 31 kg/mm², which is more than twice the bending strength of 14 kg/mm² of a multilayer printed-circuit board which is formed by laminating epoxy resin impregnated sheets and which is used in a known package disclosed in the above-mentioned reference. Thus, the ceramic relay substrate strengthens the package and prevents distortion of the package during transfer molding. Furthermore, since the ceramic relay substrate has a sufficiently high strength even if it is made in a comparatively small thickness, the package can be formed in a comparatively small thickness. The package employing the ceramic relay substrate made of a ceramic material has a high thermal resistance.

Although the pitch of the inner leads of the lead frame formed by the conventional techniques is on the order of 0.2 mm at the smallest, the conductive lines of the metallized wiring patterns of the ceramic relay substrate can be formed at minute pitches on the order of 80 μm at the smallest. Therefore, the package in this embodiment provided with the ceramic relay substrate is capable of employing a lead frame having 200 to 500 leads arranged in a high density. In contrast, a conventional package having more than 200 leads must be increased to a size much larger than that of the package with the ceramic relay substrate.

Second Embodiment

Figure 4:
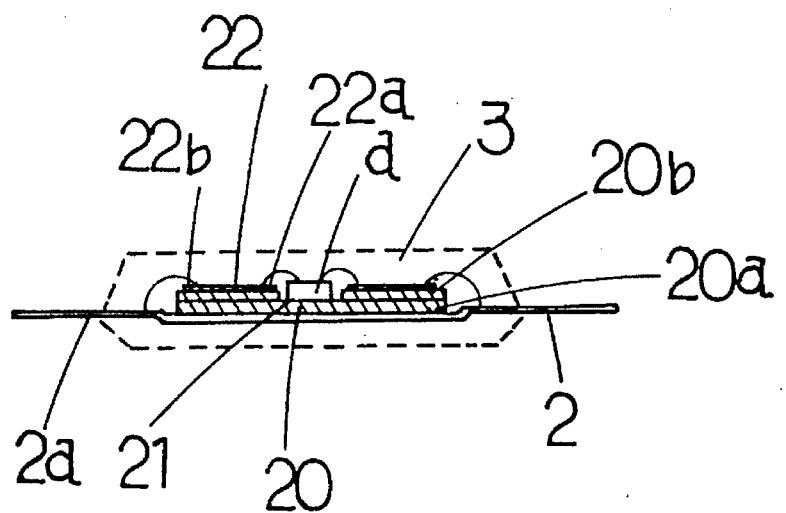
FIG. 4 is a longitudinal sectional view of a package for holding an IC chip, in a second embodiment according to the present invention.
Figure 5:
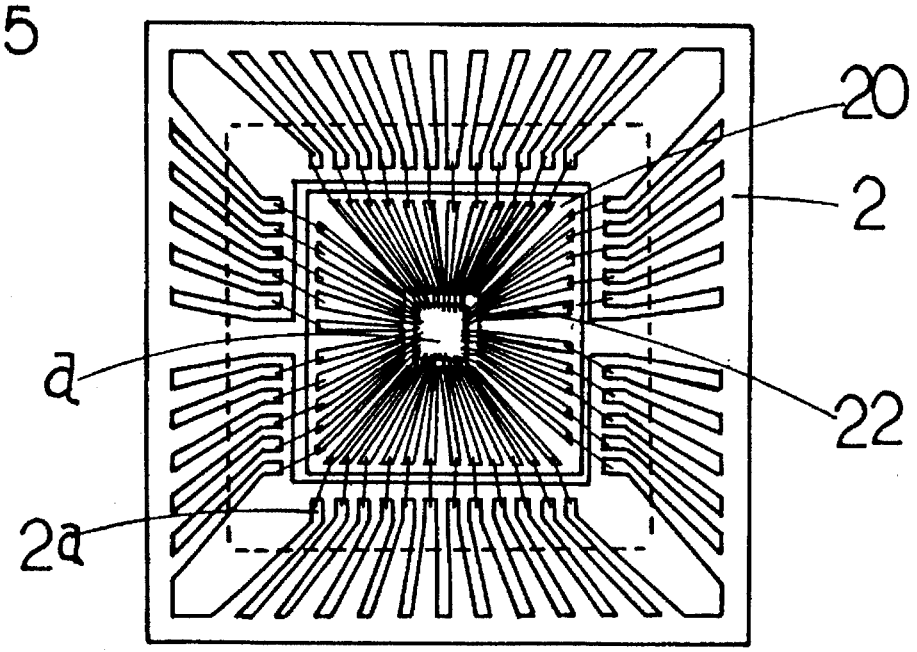
FIG. 5 is a diagrammatic top view of the package of FIG. 3.

As shown in FIGS. 4 and 5, a package for holding an IC chip, in a second embodiment according to the present invention, has a ceramic relay substrate 20 with a two-layer structure that includes a first ceramic lamina 20a and a second ceramic lamina 20b. The ceramic relay substrate 20 is provided with a cavity 21 in a central area of the upper surface thereof for receiving an IC chip a therein. The second lamina 20b of the relay substrate 20 is provided with a metallized wiring pattern 22 for electrically connecting the IC chip a as received in the cavity 21 to the leads 2a of a lead frame 2. Portions of the conductive lines of the metallized wiring pattern 22 adjacent the cavity 21 serve as inner leads 22a, and portions of the same at the periphery of the ceramic relay substrate 20 serve as outer leads 22b.

The ceramic relay substrate 20 of a two-layer construction is made by superposing (1) a green tape for lamina 20a of 21.3 mm in length, 21.3 mm in width and 0.25 mm in thickness, and a green tape for lamina 20b of 19.1 mm in length, 19.1 mm in width and 0.25 mm in thickness and provided with a metallized wiring pattern 22 and an opening corresponding to the cavity 21 in a central portion. The two-layer structure of the green tapes is fired, and the exposed portions of the metallized wiring pattern 22 are subjected to electroless Ni-plating and electroless Au-plating to plate the exposed portions of the metallized wiring pattern 22 with a Ni film having a thickness in the range of 1 μm to 9 μm and an Au film of 0.1–0.3 μm in thickness.

The assembly, which includes the ceramic relay substrate 20, the IC chip a, and part of the lead frame 2 electrically connected to the IC chip a by the metallized wiring pattern 22 formed on the surface of the ceramic relay substrate 20, is sealed in a resin molding 3 by transfer molding.

Since the package employs the ceramic relay substrate 20 having a two-layer ceramic construction formed by the two ceramic tapes, the package has a comparatively small thickness.

Third Embodiment

Figure 1:
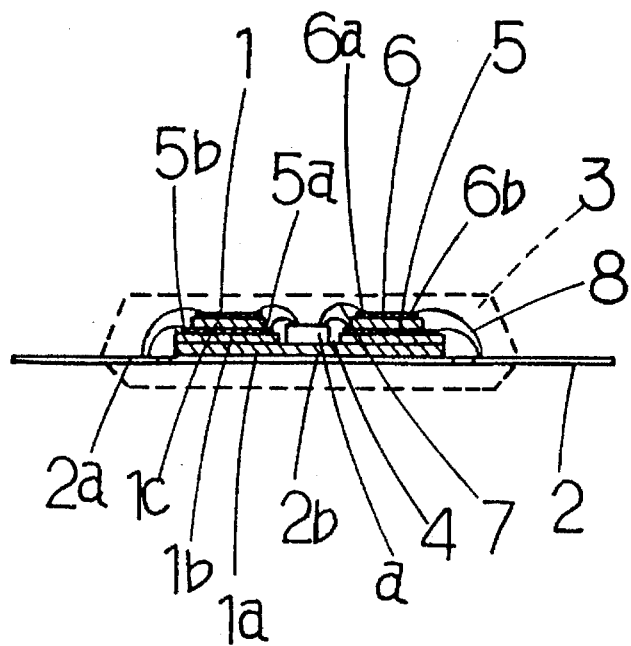
FIG. 1 is a longitudinal sectional view of a package for holding an IC chip, in a first embodiment according to the present invention.
Figure 2:
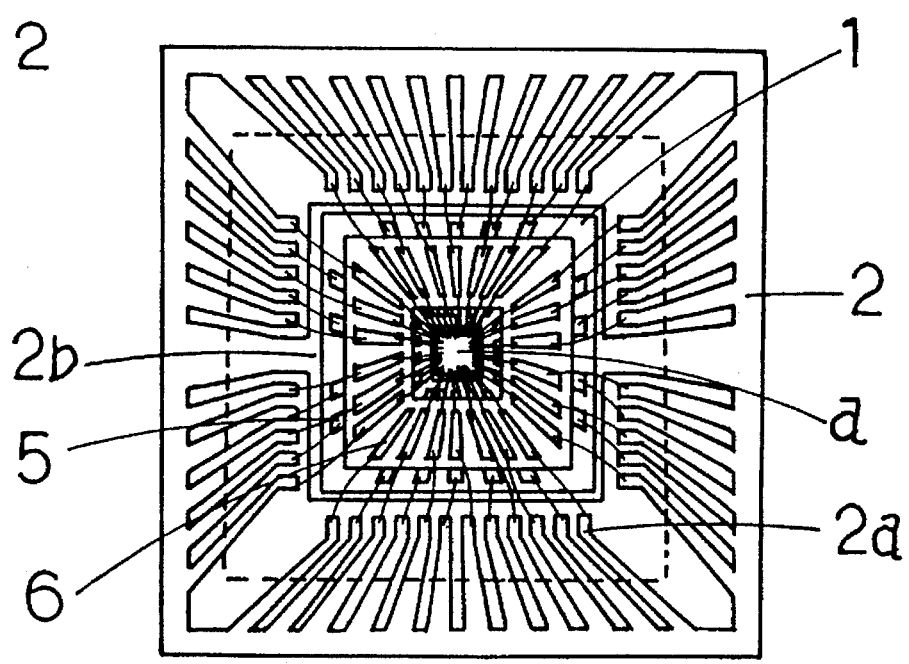
FIG. 2 is a diagrammatic top view of the package of FIG. 1.
Figure 6:
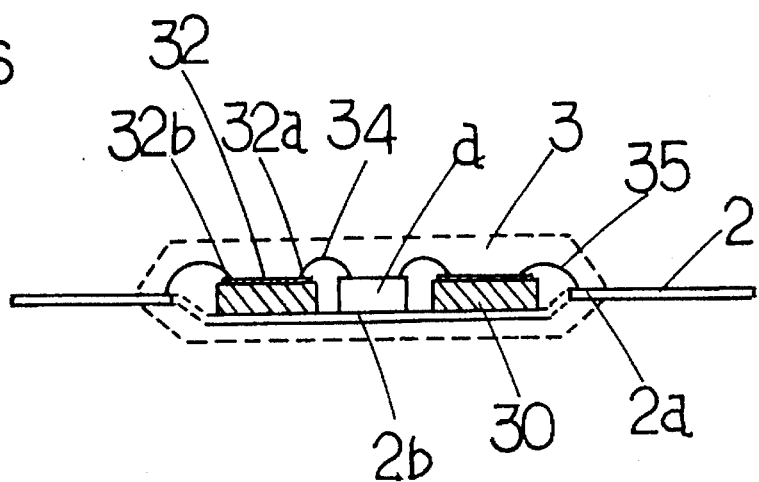
FIG. 6 is a longitudinal sectional view of a package for holding an IC chip, in a third embodiment according to the present invention.

As shown in FIG. 6, a package for holding an IC chip, in a third embodiment according to the present invention, has a ceramic relay substrate 30 formed of a single ceramic substrate having the shape of a frame and having a central opening for receiving an IC chip a therein. The ceramic relay substrate 30 of the third embodiment is not provided with any cavity corresponding to the cavities 4 and 21 of the foregoing packages (FIG. 1 and FIG. 4). The ceramic relay substrate 30 is provided with a metallized wiring pattern 32 having inner leads 32a and outer leads 32b on its surface.

Figure 7:
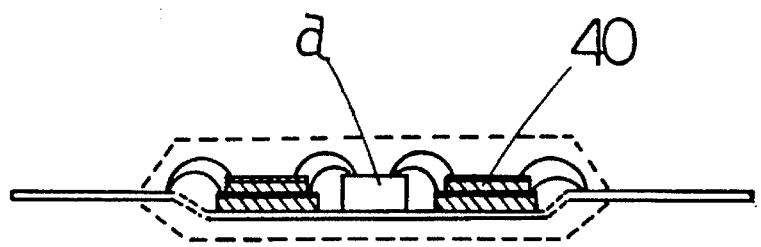
FIG. 7 is a longitudinal sectional view of a package in a further embodiment which is a modification of the package in the third embodiment of FIG. 6.

The IC chip a is put in the central opening of the ceramic relay substrate 30 so as to be seated on an island portion 2b of a lead frame 2 supporting the ceramic relay substrate 30. The IC chip a is connected electrically to the inner leads 32a of the metallized wiring pattern 32 with bonding wires 34, and the outer leads 32b of the metallized wiring pattern 32 are connected to the leads 2a of the lead frame 2 with bonding wires 35. The assembly, which includes the ceramic relay substrate 30, the IC chip a and the lead frame 2, is sealed in a resin molding 36 by transfer molding. In a modification, a ceramic relay substrate 40 having a two-layer structure using two ceramic substrates, as shown in FIG. 7, may be used.

As is apparent from the foregoing description, and according to the present invention, the IC chip is connected electrically to the lead frame through the metallized wiring pattern or patterns of the ceramic relay substrate. Therefore, an IC chip having a comparatively small size can be electrically connected to a lead frame having a comparatively large number of leads, and the ceramic relay substrate is highly thermal-resistant and has a sufficiently high strength so that it will not be distorted during transfer molding.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A package for holding an IC chip, said package comprising:

IC chip supporting means;

a lead frame having a pattern of leads extending outwardly from a central region thereof; and a ceramic relay substrate provided with a metallized wiring pattern extending outwardly from a central region thereof and corresponding to the pattern of leads of the lead frame, said ceramic relay substrate and metallized wiring being disposed between the IC chip supporting means and the leads of the lead frame;

wherein portions of the metallized wiring pattern near the IC chip as supported on the IC chip supporting means are exposed on the surface of the ceramic relay substrate to form inner leads electrically connected to the IC chip, and wherein portions of the wiring pattern in the periphery of the relay substrate adjacent to the leads of the lead frame are exposed on the surface of the ceramic relay substrate to form outer leads electrically connected to the leads of the lead frame.

2. The package for holding an IC chip according to claim 1, wherein portions of the metallized wiring pattern forming the inner leads and the outer leads are arranged in at least one of a single layer and a plurality of layers of the ceramic relay substrate.

3. The package for holding an IC chip according to claim 1, wherein the ceramic relay substrate is mounted on a central portion of the lead frame, and wherein a portion of the ceramic relay substrate mounted on the central portion of the lead frame serves as the IC chip supporting means.

4. The package for holding an IC chip according to claim 1, wherein the ceramic relay substrate is provided with a cavity, a bottom wall of the cavity serving as the IC chip supporting means.

5. A package for holding an IC chip said package comprising:

IC chip supporting means;

a lead frame having a pattern of leads extending outwardly from a central region thereof; and a ceramic relay substrate disposed between the IC chip supporting means and the leads of the lead frame; wherein the ceramic relay substrate is formed by at least one of (A) a printing of a metal paste in a wiring pattern extending outwardly from a central region thereof and corresponding to the pattern of leads of the lead frame on a ceramic green tape and subjecting the ceramic green tape provided with the printed wiring pattern to firing in order to sinter the ceramic green tape and form a metallized wiring pattern, and (B) a printing of a metal paste in a wiring pattern extending outwardly from a central region thereof and corresponding to the pattern of leads of the lead frame on each of a plurality of ceramic green tapes, superposing the plurality of ceramic green tapes provided with the printed wiring patterns to form a laminated green tape, and subjecting the laminated green tape provided with the plurality of wiring patterns to firing to sinter the laminated green tape and to form layered metallized wiring patterns;

wherein at least one of (A) portions of the metallized wiring pattern and (B) portions of the metallized wiring patterns near the IC chip supported on the IC chip supporting means are exposed on the surface of the ceramic relay substrate to form inner leads electrically connected to the IC chip, and wherein at least one of (A) portions of the metallized wiring pattern and (B) portions of the metallized wiring patterns at the periphery of the ceramic relay substrate adjacent to the leads of the lead frame are exposed on the surface of the ceramic relay substrate to form outer leads electrically connected to the leads of the lead frame.

6. The package for holding an IC chip according to claim 5, wherein portions of the metallized wiring pattern forming the inner leads and the outer leads are arranged in at least one of a single layer and a plurality of layers of the ceramic relay substrate.

7. The package for holding an IC chip according to claim 5, wherein the ceramic relay substrate is mounted on a central portion of the lead frame, and wherein a portion of the ceramic relay substrate mounted on the central portion of the lead frame serves as the IC chip supporting means.

8. The package for holding an IC chip according to claim 5, wherein the ceramic relay substrate is provided with a cavity, a bottom wall of the cavity serving as the IC chip supporting means.

9. A resin encapsulated package, said package comprising:

IC chip supporting means;

a lead frame having a pattern of leads extending outwardly from a central region thereof; and a ceramic relay substrate disposed between the IC chip supporting means and the leads of the lead frame; wherein the ceramic relay substrate is formed by at least one of (A) a printing of a metal paste in a wiring pattern extending outwardly from a central region thereof and corresponding to the pattern of leads of the lead frame on a ceramic green tape and subjecting the ceramic green tape provided with the printed wiring pattern to firing in order to sinter the ceramic green tape and form a metallized wiring pattern, and (B) printing of a metal paste in a wiring pattern extending outwardly from a central region thereof and corresponding to the pattern of leads of the lead frame on each of a plurality of the ceramic green tapes, superposing the plurality of ceramic green tapes provided with the printed wiring patterns to form laminated green tapes, and subjecting the laminated green tapes provided with the plurality of wiring patterns to firing in order to sinter the laminated green tapes and form layered metallized wiring patterns;

wherein at least one of (A) portions of the metallized wiring pattern and (B) portions of the metallized wiring patterns near the IC chip supported on the IC chip supporting means are exposed on the surface of the ceramic relay substrate to form inner leads electrically connected to the IC chip;

wherein at least one of (A) portions of the metallized wiring pattern and (B) portions of the metallized wiring patterns in the periphery of the ceramic relay substrate adjacent to the leads of the lead frame are exposed on the surface of the ceramic relay substrate to form outer leads electrically connected to the leads of the lead frame; and wherein part of the lead frame, the IC chip and the ceramic relay substrate are sealed in a resin molding.

10. The resin encapsulated package according to claim 9, wherein portions of the metallized wiring pattern forming the inner leads and the outer leads are arranged in at least one of a single layer and a plurality of layers of the ceramic relay substrate.

11. The resin encapsulated package according to claim 9, wherein the ceramic relay substrate is mounted on a central portion of the lead frame, and wherein a portion of the ceramic relay substrate mounted on the central portion of the lead frame serves as the IC chip supporting means.

12. The resin encapsulated package according to claim 9, wherein the ceramic relay substrate is provided with a cavity in the central area of its surface, a bottom wall of the cavity serving as the IC chip supporting means.

13. The package for holding an IC chip according to claim 1, wherein the ceramic relay substrate is polygonally-shaped and outer ends of the metallized wiring terminate adjacent leads of the lead frame.

14. The package for holding an IC chip according to claim 4, wherein the bottom wall is a central portion of the lead frame.

15. The package for holding an IC chip according to claim 4, wherein the bottom wall is a central portion of the ceramic relay substrate.

16. The package for holding an IC chip according to claim 5, wherein the ceramic relay substrate is polygonally-shaped and outer ends of the metallized wiring terminate adjacent leads of the lead frame.

17. The package for holding an IC chip according to claim 8, wherein the bottom wall is a central portion of the lead frame.

18. The package for holding an IC chip according to claim 8, wherein the bottom wall is a central portion of the ceramic relay substrate.

19. The resin encapsulated package according to claim 9, wherein the ceramic relay substrate is polygonally-shaped and outer ends of the metallized wiring terminate adjacent the leads of the lead frame.

20. The resin encapsulated package according to claim 12, wherein the bottom wall is a central portion of the lead frame.

21. The resin encapsulated package according to claim 12, wherein the bottom wall is a central portion of the ceramic relay substrate.

* * * * *